United States Patent [19]

Miwa

[11] Patent Number: 5,515,320
[45] Date of Patent: May 7, 1996

[54] NON-VOLATILE MEMORY

[75] Inventor: Tohru Miwa, Tokyo, Japan

[73] Assignee: NEC Corporation, Tokyo, Japan

[21] Appl. No.: 506,985

[22] Filed: Jul. 28, 1995

[30] Foreign Application Priority Data

Jul. 28, 1994 [JP] Japan .................... 6-176371

[51] Int. Cl.$^6$ ................................. H01L 29/78
[52] U.S. Cl. .................. 365/185.10; 365/230.05; 365/49
[58] Field of Search .............. 365/185.10, 185.12, 365/185.16, 230.05, 49

[56] References Cited

U.S. PATENT DOCUMENTS

| | | | |
|---|---|---|---|
| 4,479,203 | 10/1984 | Kuo ..................... | 365/185.10 |
| 4,527,256 | 7/1985 | Giebel .................. | 365/185.10 |
| 4,573,144 | 2/1986 | Countryman, Jr. ........ | 365/185.10 |
| 4,630,087 | 12/1986 | Momodomi .............. | 365/185.12 |

OTHER PUBLICATIONS

Akio Kokubu et al., "Orthogonal Memory–A Step Toward Realization of Large Capacity Associative Memory", *IFIP*, 1986, pp. 165–174.

*Primary Examiner*—David C. Nelms
*Assistant Examiner*—Vu A. Le
*Attorney, Agent, or Firm*—Sughrue, Mion, Zinn, Macpeak & Seas

[57] ABSTRACT

The non-volatile memory includes (A) a cell array including (a) memory cells arranged to form rows and columns, each cell having first and second transistors which commonly have a floating gate, (b) first and second gate lines, each connected with gates of the first and second transistors of the memory cells disposed in each of the rows and columns, respectively, (c) first and second drain lines, each connected with drains of the first and second transistors of the memory cells disposed in each of the columns and rows, respectively, and (d) source lines, each connected with sources of the first and second transistors, (B) a first voltage supplier for applying a first or second voltage to each of the first gate lines in accordance with a first input signal, (C) a detector for detecting a current running through the first drain lines and further transmitting a first output signal, (D) a second voltage supplier for applying a first or second voltage to each of the second gate lines in accordance with a second input signal, and (E) a detector for detecting a current running through the second drain lines and further transmitting a second output signal. The non-volatile memory can have functions of an orthogonal memory and a content address memory. In addition, since it is possible to compose a memory cell of two transistors, the non-volatile memory provides advantages of smaller size, larger capacitance, and lower consumption of electrical power.

14 Claims, 9 Drawing Sheets

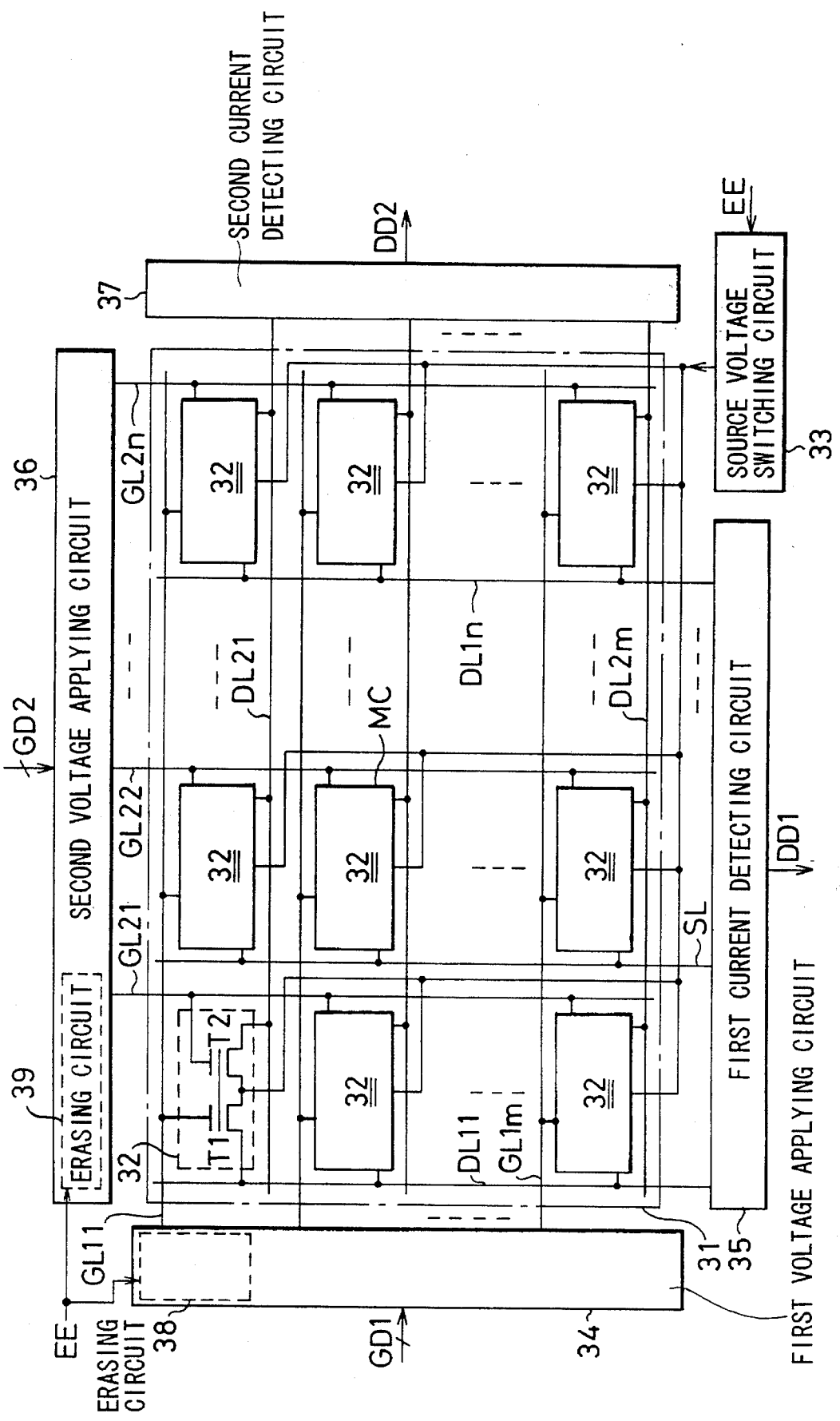

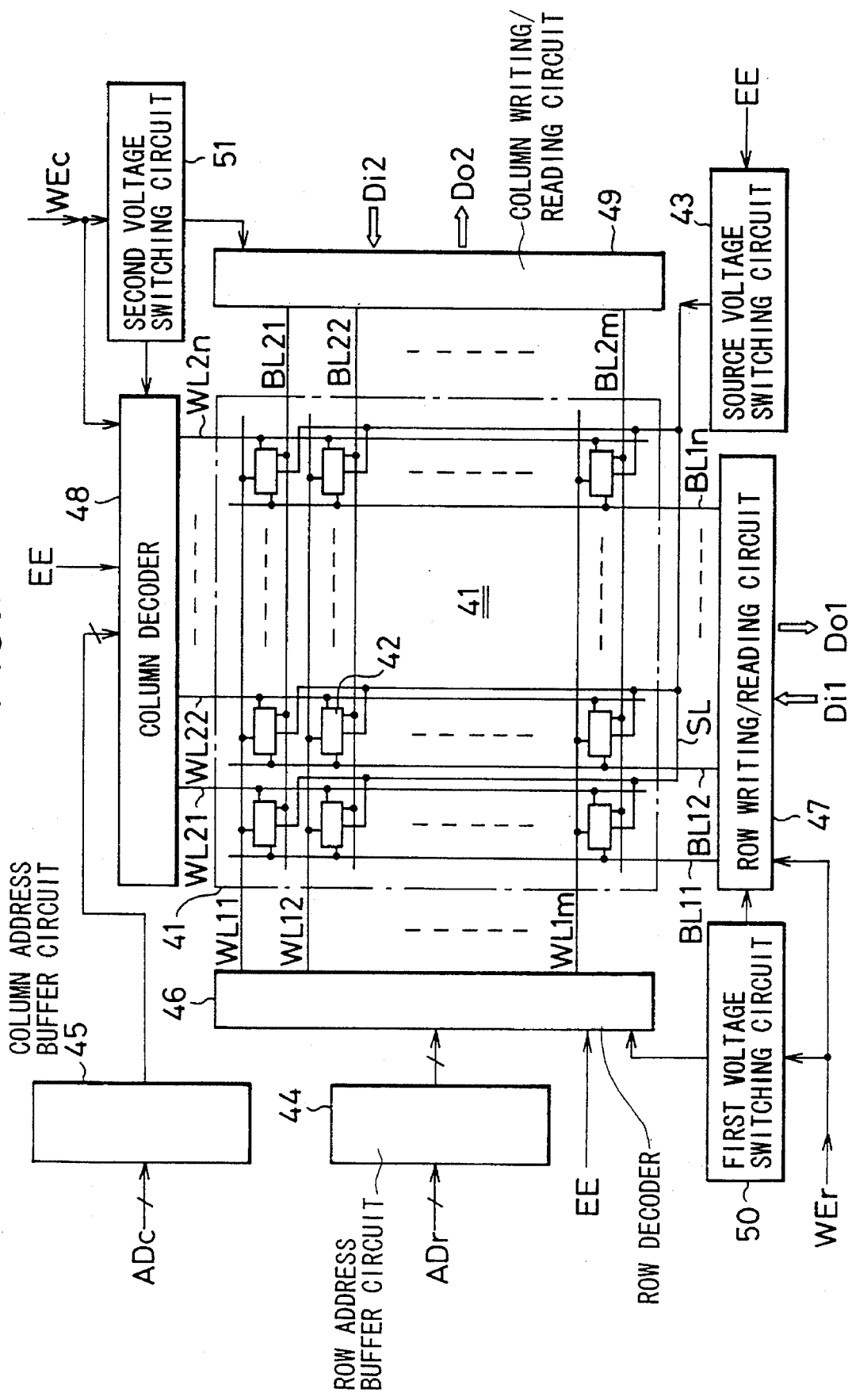

NON-VOLATILE MEMORY

BACKGROUND OF THE INVENTION

1. Field of the Invention

The invention relates to a non-volatile memory, and more particularly to a floating gate transistor type non-volatile memory having a function of an orthogonal memory or a content address memory.

2. Description of the Related Art

In a floating gate transistor type non-volatile memory such as UVEPROM (Ultra Violet Erasable Programmable Read Only Memory) and a flash type EEPROM (Electrically Erasable Programmable Read Only Memory), it is possible to electrically write data into the memory. In particular, it is possible to electrically erase data in a flash type EEPROM.

Each of memory cell employed in such memories is constituted by a cell transistor having a source, a drain, a control gate, and a floating gate. The cell transistor thus constructed stores data therein utilizing the fact that a threshold voltage is varied in accordance with a quantity of charges accumulated in the floating gate. On reading data stored in the memory cell, the content of stored data is judged in dependence on whether a current flows between the drain and the source of the cell transistor when a reading voltage is applied to the control gate thereof. In writing and erasing the data, on the other hand, a higher voltage than the reading voltage is applied to make electric charges to move between the floating gate and a substrate in which the cell transistor is formed, thereby controlling a quantity of charges to be accumulated in the floating gate.

FIG. 1 is a conceptual block diagram of a conventional non-volatile memory constituted as a flash type EEPROM.

The illustrated non-volatile memory comprises a memory cell array 1. This memory cell array 1 includes a plurality of memory cell transistors 2 arranged in a matrix. Each of the memory cell transistors 2 has a floating gate. The cell array 1 further has a plurality of gate lines GL associated with each of rows of the memory cells 2, and each of the gate lines GL is in electrical connection with control gates of the cell transistors 2 disposed in an associated row. There are also disposed a plurality of drain lines DL associated with each of columns of the cell transistors 2, and each of the drain lines DL is in electrical connection with drains of the cell transistors 2 disposed in an associated column. A plurality of source lines SL are in electrical connection with sources of the transistors of each of the memory cells arranged in a matrix.

The non-volatile memory further includes a column address buffer circuit 3, a row address buffer circuit 4, a row decoder 5, a source voltage switching circuit 6, a column decoder 7, a writing/reading circuit 8, and a voltage switching circuit 9. The column address buffer circuit 3 and the row address buffer circuit 4 receive column address signals ADc and row address signals ADr, respectively, from external devices (not illustrated), and accumulate them therein and transmitting them. The row decoder 5 applies a ground potential to all of the gate lines GL of the cell array 1 on an erasing operation in which erasing signals EE are in active level. On operations other than an erasing operation, such as writing and reading operations, the row decoder 5 selects one of the gate lines GL in accordance with the row address signals ADr transmitted form the row address buffer circuit 4, and further applies a selection voltage to the selected gate line. The selection voltage is in general 12 V in a writing operation, and 5 V in a reading operation. The source voltage switching circuit 6 applies a voltage for erasion, which is in general 12 V, to the source lines SL on an erasing operation, and applies a ground voltage to the source lines SL in operations other than an erasing operation. The column decoder 7 selects one of the drain lines DL in accordance with the column address signals ADc transmitted from the column address buffer circuit 3. The writing/reading circuit 8 applies a voltage for writing, which is in general 6 V and which corresponds to data Di received therein, on a writing operation, and applies a bias voltage, which is in general 1 V, to the selected drain line DL on a reading operation. The writing/reading circuit 8 further detects a voltage level responsive to a current flowing through the selected drain line DL and amplifies the detected voltage level, and generates an output Do. The voltage switching circuit 9 generates a voltage on a writing and a reading operations. The voltage is supplied to the drain lines DL and the gate lines GL through the writing/reading circuit 8 and the column decoder 7, and the row decoder 5, respectively.

Reading of data stored in the memory cell 2 is carried out as follows. First, the source lines SL are grounded. Then, the row decoder 5 applies a supply voltage to a selected gate line, and applies a ground voltage to non-selected gate lines. The column decoder 7 selects one of the drain lines DL, and then the writing/reading circuit 8 detects a current running through the thus selected drain line DL, thereby reading data stored in the memory cell being performed. In general, the logic 1 is assigned when the current is detected, whereas the logic 0 is assigned when the current is not detected.

Writing data to the memory cell 2 is carried out as follows. The row decoder 5 selects one of gate lines GL, and applies approximately 12 V to the selected gate line GL. The writing/reading circuit 8 applies approximately 6 V to the drain lines DL. Thus, hot electrons are injected in a floating gate of the cell transistors 2. Thus, data writing operation is completed. A threshold voltage of the memory cell transistors, which is about 7 V, becomes higher than a gate voltage to be generated on reading operation.

An erasing operation is carried out by applying a ground voltage to all of the gate lines GL and also applying a high voltage, which is in general about 12 V, to the source lines SL to thereby extract electrons to a source out of floating gates of all the memory cell transistors of the cell array 1 by virtue of tunnel effect. A threshold voltage of the memory cell transistors lowers below a gate voltage to be generated on a reading operation.

The flash type memory thus constructed is often employed in an image processor in which two-dimensional data are arranged in a matrix, such as an image bit map and letter font, and data successively situated in a row direction is considered as a unit. A plurality of such units arranged in a column direction are stored in the image processor. When lateral turning of an image bit map or letter font is to be carried out, data stored in the image processor with data successively situated in a row direction being considered as a unit is read out as if such data successively situated in a column direction is a unit. A memory having a function by which the above mentioned operation can be carried out at high speed is referred to as an orthogonal memory.

FIGS. 2A and 2B illustrate block diagrams of a conventional volatile memory having a function of an orthogonal memory.

The illustrated volatile memory comprises a cell array 11. This cell array 11 includes a plurality of memory cells 12 arranged in a matrix. Each of the memory cells 12 has transistors Q1 to Q8, as illustrated in FIG. 2B. There are disposed a plurality of first word lines WL1j (j indicates an integer raging from 1 to m both inclusive) associated with each of rows of the memory cells 12, and each of the first word lines WL1j is in electrical connection with first selection terminals of the memory cells 12 disposed in an associated row. Herein, the first selection terminals indicate gates of the transistors Q5 and Q6. There are also disposed a plurality of first bit lines BL1ia and BL1ib (i indicates an integer ranging from 1 to n both inclusive) associated with each of columns of the memory cells 12, and each of the first bit lines BL1ia and BL1ib is in electrical connection with first data terminals of the memory cells 12 disposed in an associated column. Herein, the first data terminals indicate drains of the transistors Q5 and Q6. There are further disposed a plurality of second word lines WL2i associated with each of columns of the memory cells 12, and each of the second word lines WL2i is in electrical connection with second selection terminals of the memory cells 12 disposed in an associated column. Herein, the second selection terminals indicate gates of the transistors Q7 and Q8. There are further disposed a plurality of second bit lines BL2ja and BL2jb associated with each of rows of the memory cells 12, and each of the second bit lines BL2ja and BL2jb is in electrical connection with second data terminals of the memory cells 12 disposed in an associated row. Herein, the second data terminals indicate drains of the transistors Q7 and Q8.

The volatile memory further includes a column address buffer circuit 13, a row address buffer circuit 14, a row decoder 15, a column decoder 17, a row writing/reading circuit 18, and a column writing/reading circuit 19. The column address buffer circuit 13 and the row address buffer circuit 14 receive column address signals ADc and row address signals ADr, respectively, from peripheral devices (not illustrated), and accumulate them therein and transmitting them. The row decoder 15 selects one of the first word lines WL1j in accordance with the row address signals ADr transmitted form the row address buffer circuit 14. The column decoder 17 selects one of the second word lines WL2i in accordance with the column address signals ADc transmitted from the column address buffer circuit 13. On a row reading operation in which row reading signals are in active level, the row writing/reading circuit 18 detects data stored in the memory cells 12 connected to the first word line WL1j selected by the row decoder 15, in accordance with the signals appearing through the first bit lines BL1ia and BL1ib, and amplifies the thus detected data, and transmits the amplified data as an output Do1. On a row writing operation in which row writing signals are in active level, the row writing/reading circuit 18 provides row writing signals corresponding to input data Di1 with the first bit lines BL1ia and BL1ib. The column writing/reading circuit 19 detects data stored in the memory cells 12 connected to the second word line WL2i selected by the column decoder 17, in accordance with the signals appearing through the second bit lines BL2ja and BL2jb, and amplifies the thus detected data, and transmits the amplified data as an output Do2. On a column writing operation in which column writing signals are in active level, the column writing/reading circuit 19 provides column writing signals corresponding to input data Di2 with the second bit lines BL2ja and BL2jb.

In this orthogonal memory, reading or writing data in a row direction can be carried out by means of the row decoder 15 and the row writing/reading circuit 18. Similarly, reading or writing data in a column direction can be carried out by means of the column decoder 17 and the column writing/reading circuit 19.

There has been suggested another sample of an orthogonal memory by Akio Kokubu, Minoru Kuroda and Tatsumi Furuya: Orthogonal Memory—A Step Toward Realization of Large Capacity Associative Memory, IFIP, pp 165–174, 1986. FIG. 3 illustrates the memory cell, which consists of a flip-flop circuit having four transfer gates. Compared with a conventional static RAM, two transfer gates Q6 and Q8 are added for bit slice access to drive the word lines. They are paired with transfer gates Q5 and Q7, and are connected to the flip-flop circuit. The gate of Q7 is connected to the word line (0) paired with the word line (1). This makes orthogonal control possible.

In bit slice access, bit lines (0) and (1) are activated to high, and the transfer gates Q6 and Q8 are turned on. When the cell state is held as A being high and B being low, the word line (1) is activated to high via the transfer gate Q6. The transfer gate Q5 is also turned on by activation of the word line (1). The cell state, nevertheless, is not affected because A is already high. The word line (0) is not activated to high via the transfer gate Q8 because B is low. Thus, the transfer gate Q7 is not turned on and the cell state is not affected.

In word slice access, word lines (0) and (1) are activated to high, and the transfer gates Q5 and Q7 are turned on. Operation of the memory proceeds in the same way as bit slice access.

As aforementioned, the orthogonal memory can carry out operations of reading and writing data arranged in a matrix at high speed in both row and column directions, and hence is quite useful for various operations such as lateral turning of an image bit map or letter font.

As another type of a memory suitable for use of a device such as a data base processor is there a content address memory. The content address memory has a function for carrying out collective comparison of a plurality of words stored therein with a given word to be retrieved. The content address memory is applicable to a translation lookaside buffer (TLB) of a cash memory capable of carrying out high speed comparison of given data with stored data, and also applicable to an apparatus for retrieving data base.

FIG. 4A is a block diagram of a conventional volatile memory having a function of a content address memory. FIG. 4B is an enlarged view illustrating a memory cell. The illustrated volatile memory comprises a cell array 21. The cell array 21 includes a plurality of memory cells 22 arranged in a matrix. Each of the memory cells 22 has transistors Q1 to Q10, as illustrated in FIG. 4B. There are disposed a plurality of word lines WL1j associated with each of rows of the memory cells 22, and each of the word lines WL1j is in electrical connection with selection terminals of the memory cells 22 disposed in an associated row. Herein, the selection terminals indicate gates of the transistors Q5 and Q6. There are also disposed a plurality of bit lines BL1ia and BL1ib associated with each of columns of the memory cells 22, and each of the bit lines BL1ia and BL1ib is in electrical connection with data terminals of the memory cells 22 disposed in an associated column. Herein, the data terminals indicate drains of the transistors Q5 and Q6. There are further disposed a plurality of retrieval lines IL1ia and IL1ib associated with each of columns of the memory cells 22, and each of the retrieval lines IL1ia and IL1ib is in electrical connection with selection terminals of the memory cells 22 disposed in an associated column. Herein, the selection terminals indicate gates of the transistors Q9 and Q10. There are further disposed a plurality of coincidence lines MLj associated with each of rows of the memory cells 22, and each of the coincidence lines MLj is in electrical connection with coincidence terminals of the memory cells 22 disposed in an associated row. Herein, the coincidence terminals indicate drains of the transistors Q7 and Q8.

The volatile memory further includes a row address buffer circuit 23, a row decoder 24, a writing/reading circuit 25, a retrieval data register 26 and a coincidence judging circuit 27. The row address buffer circuit 23 receive address signals AD from peripheral devices (not illustrated), and accumulate them therein and transmitting them. The row decoder 24 selects one of the word lines WL1j in accordance with the address signals AD transmitted form the row address buffer circuit 23. On a reading operation in which reading signals are in active level, the writing/reading circuit 25 detects data stored in the memory cells 22 connected to the word line WL1j selected by the row decoder 24, in accordance with the signals appearing through the bit lines BL1ia and BL1ib, and amplifies the thus detected data, and transmits the amplified data as an output Do. The writing/reading circuit 25, on a writing operation in which writing signals are in active level, provides the writing signals corresponding to input data Di with the bit lines BL1ia and BL1ib. The retrieval data register 26 accumulates retrieval data SD transmitted from outside, and on a retrieving operation in which retrieval signals are in active level, the retrieval data register 26 provides retrieval signals corresponding to the retrieval data SD with the retrieval lines ILia and ILib. The coincidence judging circuit 27, on a retrieving operation, judges as to whether data stored in the memory cells 22 connected to each of the coincidence lines ML is coincident with the retrieval data SD, in accordance with signals transmitted through the coincidence lines MLj. The coincidence judging circuit 27 amplifies a result, and provides as an output MD.

In this volatile memory, data stored in the memory cells connected to one of the word lines WL1j is treated as one word. The row decoder 24 and the writing/reading circuit 25 cooperate to make it possible to read and write data word by word. In addition, the retrieval data register 26 and the coincidence judging circuit 27 cooperate to make it possible to retrieve all words in parallel as to whether a given word is coincident with the retrieval data SD.

However, since these memories are volatile, data stored in the memories is erased by turning a power supply off. Hence, complicated operations are necessary on turning off a power supply, such as moving the stored data to a non-volatile device such as a hard disk and writing them again into the volatile memories when a power supply is turned on again. Even if those volatile memories can be modified into non-volatile memories by using floating gate transistors, for instance, as the transistors Q1 and Q2 of the memory cell, it would be necessary to use eight orthogonal memories or ten content address memories for one memory cell, making it quite difficult to obtain a smaller size, a larger capacitance and lower consumption of electrical power.

On the other hand, in the earlier mentioned floating gate transistor type non-volatile memory, since one memory cell is composed of one floating gate transistor, it is possible to obtain a smaller size, a larger capacitance and lower consumption of electrical power. However, the structure of the non-volatile memory as it is cannot perform a function of an orthogonal memory and a content address memory in which four terminals are required for one memory cell, such as a selection terminal, a data terminal, a retrieval terminal and a coincidence terminal.

As having been described, a conventional floating gate transistor type non-volatile memory has an advantage that it is possible to obtain a smaller size, a larger capacitance and lower consumption of electrical power since one memory cell is composed of one floating gate transistor, but also has a disadvantage that it is not possible to perform a function of an orthogonal memory and a content address memory in which four terminals are required for one memory cell, such as a selection terminal, a data terminal, a retrieval terminal and a coincidence terminal. A conventional memory having a function of an orthogonal memory and a content address memory needs to carry out complicated operations such as moving stored data into another medium and writing them again, since the memory is volatile. Even if the volatile memory in question can be modified into a non-volatile memory by replacing floating gate transistors with originally used transistors of the memory cell, it would be necessary to use a number of transistors for one memory cell, making it quite difficult to obtain a smaller size of a memory, a larger capacitance and lower consumption of electrical power.

SUMMARY OF THE INVENTION

In view of the foregoing problems of prior memories, it is an object of the present invention to provide a non-volatile memory having a function of an orthogonal memory and a content address memory and making it possible to obtain a smaller size of a memory, a larger capacitance and lower consumption of electrical power.

The invention provides a non-volatile memory including (A) a cell array, the cell array having (a) a plurality of memory cells arranged in a form of a matrix, each of the memory cells having first and second transistors which commonly have a floating gate and storing data therein in accordance with a quantity of electric charge accumulated in the floating gate, (b) a plurality of first gate lines associated with each of rows of the plurality of memory cells, each of the plurality of first gate lines being in electrical connection with gates of the first transistors of the memory cells disposed in an associated row, (c) a plurality of first drain lines associated with each of columns of the plurality of memory cells, each of the plurality of first drain lines being in electrical connection with drains of the first transistors of the memory cells disposed in an associated column, (d) a plurality of second gate lines associated with each of columns of the plurality of memory cells, each of the plurality of second gate lines being in electrical connection with gates of the second transistors of the memory cells disposed in an associated column, (e) a plurality of second drain lines associated with each of rows of the plurality of memory cells, each of the plurality of second drain lines being in electrical connection with drains of the second transistors of the memory cells disposed in an associated row, and (f) a plurality of source lines, each being in electrical connection with sources of the first and second transistors of each of the memory cells, (B) a first voltage applying circuit for applying one of a selection voltage and a non-selection voltage to each of the first gate lines in accordance with a first gate receiving signal, (C) a first current detecting circuit for detecting a current running through the plurality of first drain lines and correspondingly transmitting a first drain current signal, (D) a second voltage applying circuit for applying one of a selection voltage and a non-selection voltage to each of the second gate lines in accordance with a second gate receiving signal, and (E) a second current detecting circuit for detecting a current running through the plurality of second drain lines and correspondingly transmitting a second drain current signal.

The invention further provides a non-volatile memory including (A) a cell array, the cell array having (a) a plurality of memory cells arranged in a form of a matrix, each of the memory cells having first and second transistors which commonly have a floating gate and storing data therein in accordance with a quantity of electric charge accumulated in the floating gate, (b) a plurality of first gate lines associated with each of rows of the plurality of memory cells, each of the plurality of first gate lines being in electrical connection with gates of the first transistors of the memory cells disposed in an associated row, (c) a plurality of first drain lines associated with each of columns of the plurality of memory cells, each of the plurality of first drain lines being in electrical connection with drains of the first transistors of the memory cells disposed in an associated column, (d) a plurality of second gate lines associated with each of columns of the plurality of memory cells, each of the plurality of second gate lines being in electrical connection with gates of the second transistors of the memory cells disposed in an associated column, (e) a plurality of second drain lines associated with each of rows of the plurality of memory cells, each of the plurality of second drain lines being in electrical connection with drains of the second transistors of the memory cells disposed in an associated row, and (f) a plurality of source lines, each being in electrical connection with sources of the first and second transistors of each of the memory cells, (B) a first voltage applying circuit for applying a selection voltage to one of the plurality of first gate lines in accordance with a row address signal contained in a first gate receiving signal on a row reading operation, (C) a row reading circuit for detecting a current running through the plurality of first drain lines on a row reading operation, (D) a second voltage applying circuit for applying a selection voltage to one of the plurality of second gate lines in accordance with a column address signal contained in a second gate receiving signal on a column reading operation, and (E) a column reading circuit for detecting a current running through the plurality of second drain lines on a column reading operation.

The invention still further provides a non-volatile memory including (A) a cell array, the cell array having (a) a plurality of memory cells arranged in a form of a matrix, each of the memory cells having first and second transistors which commonly have a floating gate and storing data therein in accordance with a quantity of electric charge accumulated in the floating gate, (b) a plurality of first gate lines associated with each of rows of the plurality of memory cells, each of the plurality of first gate lines being in electrical connection with gates of the first transistors of the memory cells disposed in an associated row, (c) a plurality of first drain lines associated with each of columns of the plurality of memory cells, each of the plurality of first drain lines being in electrical connection with drains of the first transistors of the memory cells disposed in an associated column, (d) a plurality of second gate lines associated with each of columns of the plurality of memory cells, each of the plurality of second gate lines being in electrical connection with gates of the second transistors of the memory cells disposed in an associated column, (e) a plurality of second drain lines associated with each of rows of the plurality of memory cells, each of the plurality of second drain lines being in electrical connection with drains of the second transistors of the memory cells disposed in an associated row, and (f) a plurality of source lines, each being in electrical connection with sources of the first and second transistors of each of the memory cells, (B) a voltage applying circuit for applying a selection voltage to one of the plurality of first gate lines in accordance with a row address signal contained in a first gate receiving signal on a row reading operation, (C) a row reading circuit for detecting a current running through the plurality of first drain lines on a row reading operation, (D) a retrieval data setting circuit for applying one of a selection voltage and a non-selection voltage to each of the plurality of second gate lines in accordance with retrieval data contained in a second gate receiving signal on a retrieving operation, and (E) a coincidence determining circuit for detecting a current running through the plurality of second drain lines on a retrieving operation.

The invention yet further provides a non-volatile memory including (A) a cell array, the cell array having (a) a plurality of memory devices, arranged to form rows and columns, for storing data therein, each having first and second transistors which commonly have a floating gate, (b) a plurality of first gate lines, each being in electrical connection with gates of the first transistors of the memory devices disposed in each of the rows, (c) a plurality of first drain lines, each being in electrical connection with drains of the first transistors of the memory devices disposed in each of the columns, (d) a plurality of second gate lines, each being in electrical connection with gates of the second transistors of the memory devices disposed in each of columns, (e) a plurality of second drain lines, each being in electrical connection with drains of the second transistors of the memory devices disposed in each of rows, and (f) a plurality of source lines, each being in electrical connection with sources of the first and second transistors of each of the memory devices, (B) a device for applying one of first and second voltages to each of the first gate lines in accordance with a first input signal, (C) a device for detecting a current running through the plurality of first drain lines and further transmitting a first output signal, (D) a device for applying one of first and second voltages to each of the second gate lines in accordance with a second input signal, and (E) a device for detecting a current running through the plurality of second drain lines and further transmitting a second output signal.

The advantages obtained by the aforementioned present invention will be described hereinbelow.

As aforementioned, the non-volatile memory in accordance with the invention includes a plurality of the memory cells arranged in a matrix, each of the memory cells having the first and second transistors having commonly a floating gate. Each of the first gate lines connects the gates of the first transistors of the memory cells disposed in each of the rows, to one another. Each of the first drain lines connects the drains of the first transistors of the memory cells disposed in each of the columns, to one another. Each of the second gate lines connects the gates of the second transistors of the memory cells disposed in each of the columns, to one another. Each of the second drain lines connects the drains of the second transistors of the memory cells disposed in each of the columns, to one another. One of the first gate lines is selected in accordance with the first gate input signal, and similarly one of the second gate lines is selected in accordance with the second gate input signal. Then, a certain selection voltage is applied to the thus selected first and second gate lines. Then, a current running through the first and second drain lines is detected, respectively. By virtue of the structure as mentioned so far, the non-volatile memory in accordance with the invention provides a function of a non-volatile orthogonal memory and content address memory. In addition, it is possible in the invention to compose one memory cell of only two transistors. As a result, the invention provides a smaller size of a memory, a larger capacitance and a lower consumption of electrical power.

BRIEF DESCRIPTION OF THE DRAWINGS

FIG. 5 is a block diagram of a non-volatile memory in accordance with the first embodiment of the present invention.

FIG. 7 is a block diagram of a non-volatile memory in accordance with the second embodiment of the present invention.

DESCRIPTION OF THE PREFERRED EMBODIMENTS

Figure 1:
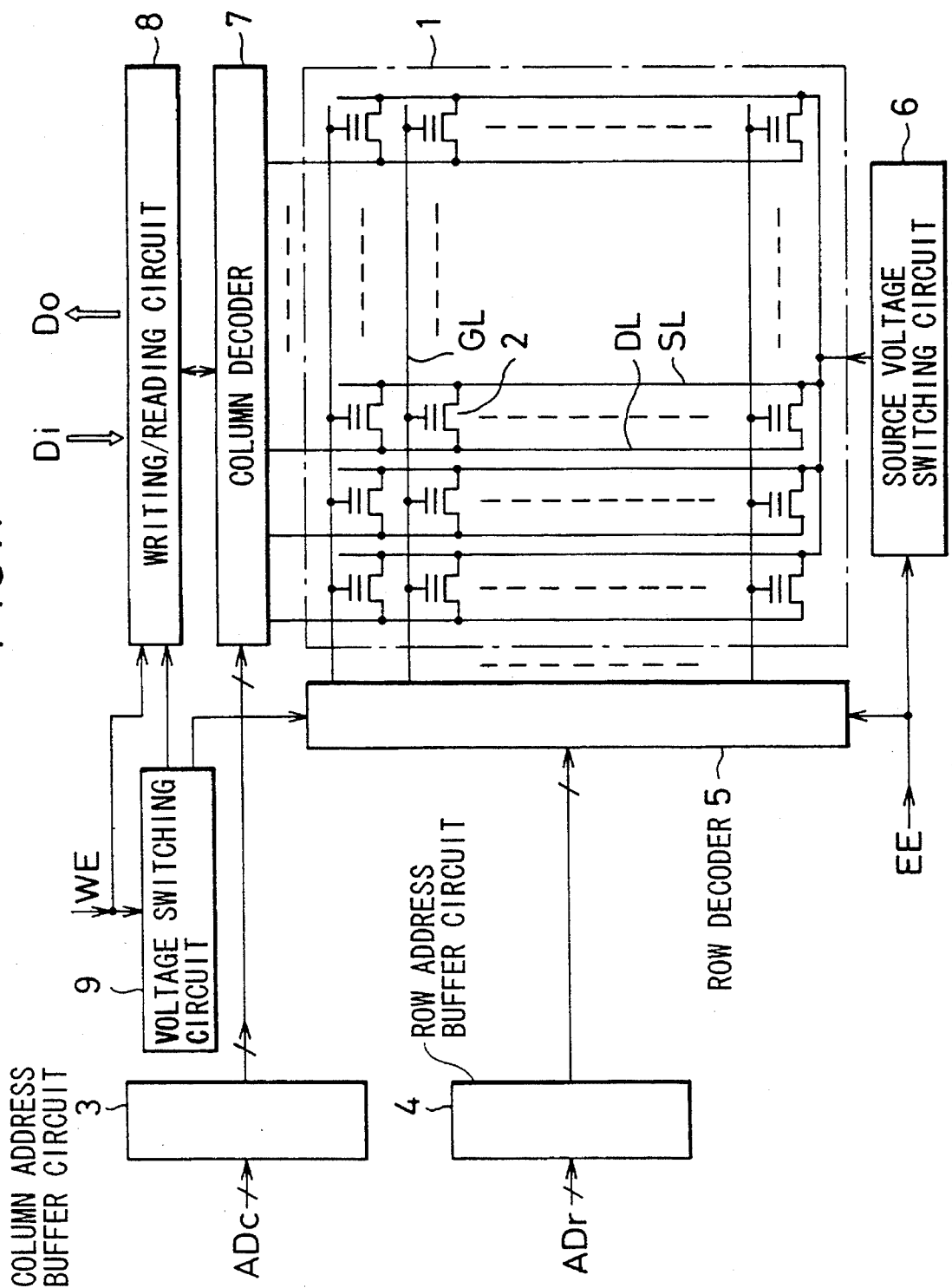
FIG. 1 is a block diagram of a conventional non-volatile memory.
Figure 2A:
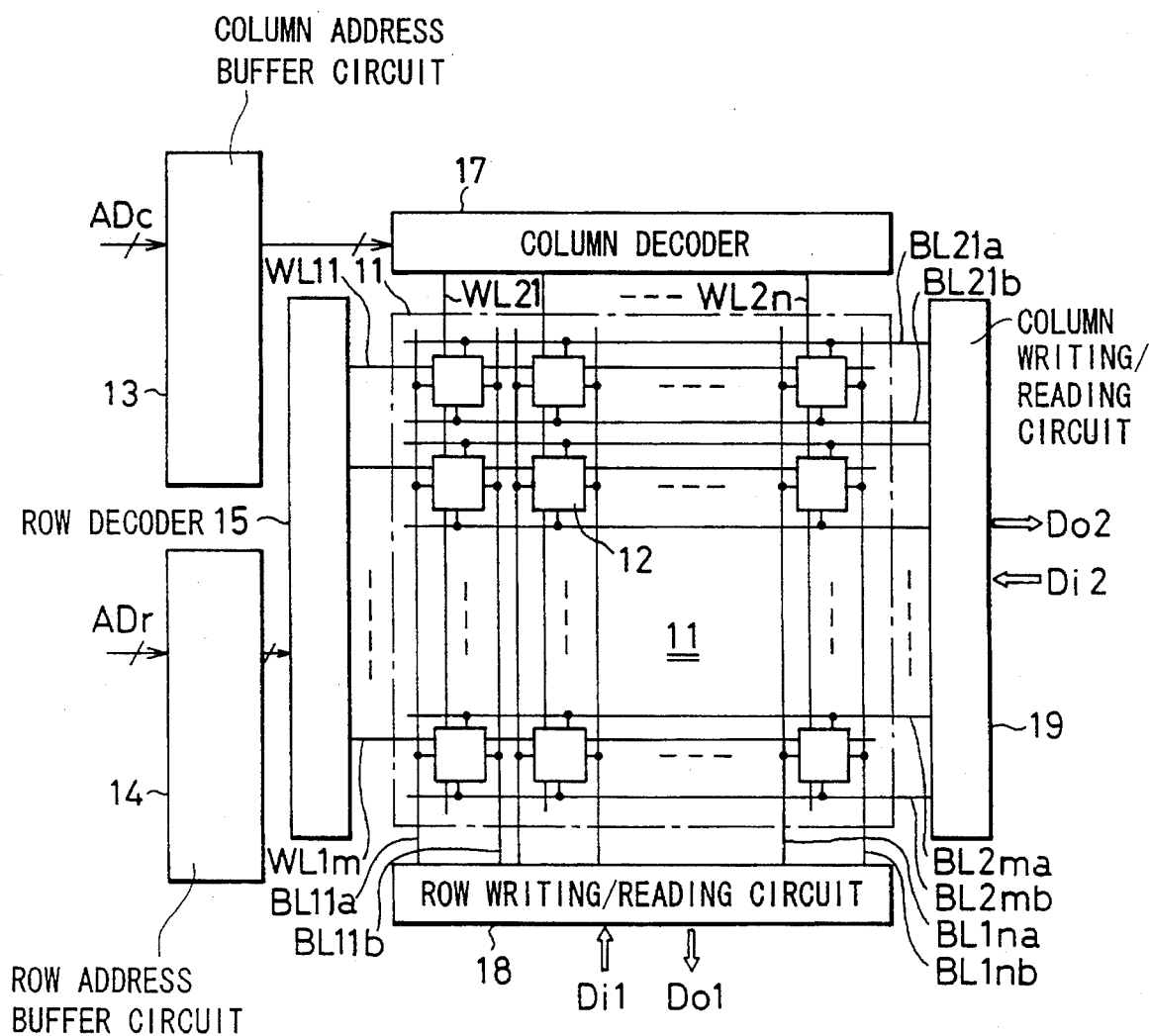
FIG. 2A is a block diagram of a conventional volatile memory having a function of an orthogonal memory.
Figure 2B:
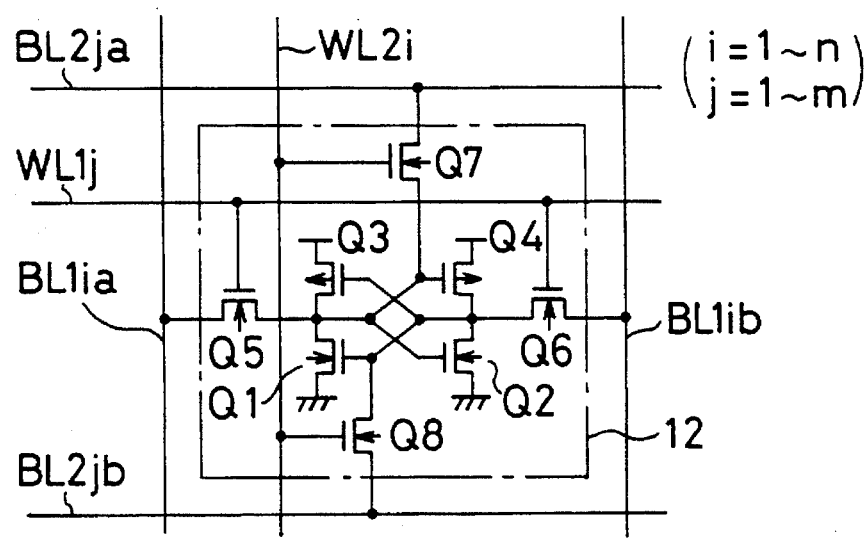
FIG. 2B is an enlarged circuit diagram of a memory cell used in the volatile memory illustrated in FIG. 2A.
Figure 3:
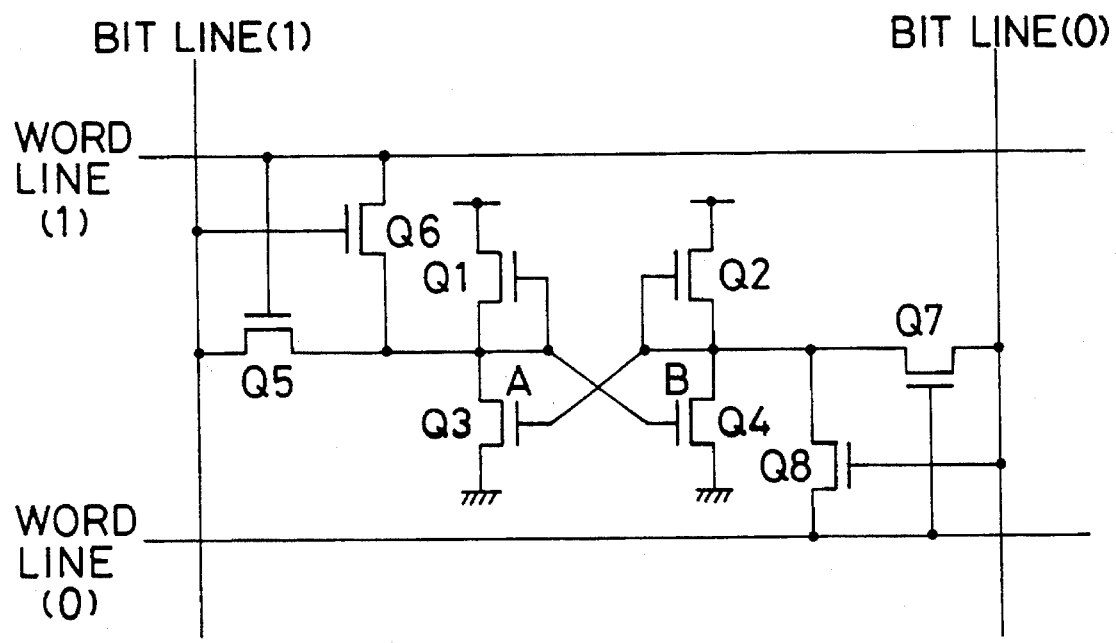
FIG. 3 is a partial block diagram of a conventional orthogonal memory cell.
Figure 4A:
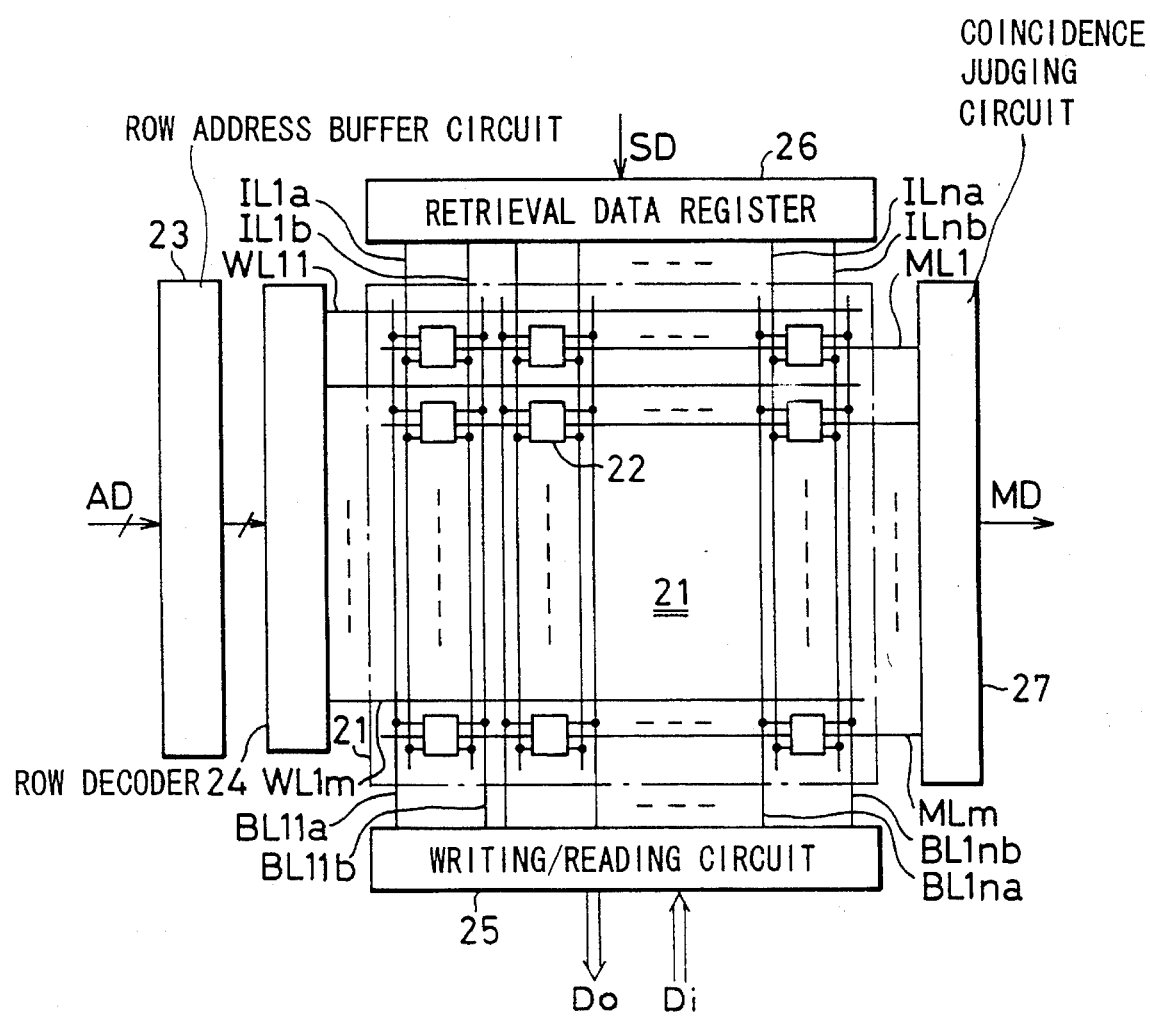
FIG. 4A is a block diagram of a conventional volatile memory having a function of a content address memory.
Figure 4B:
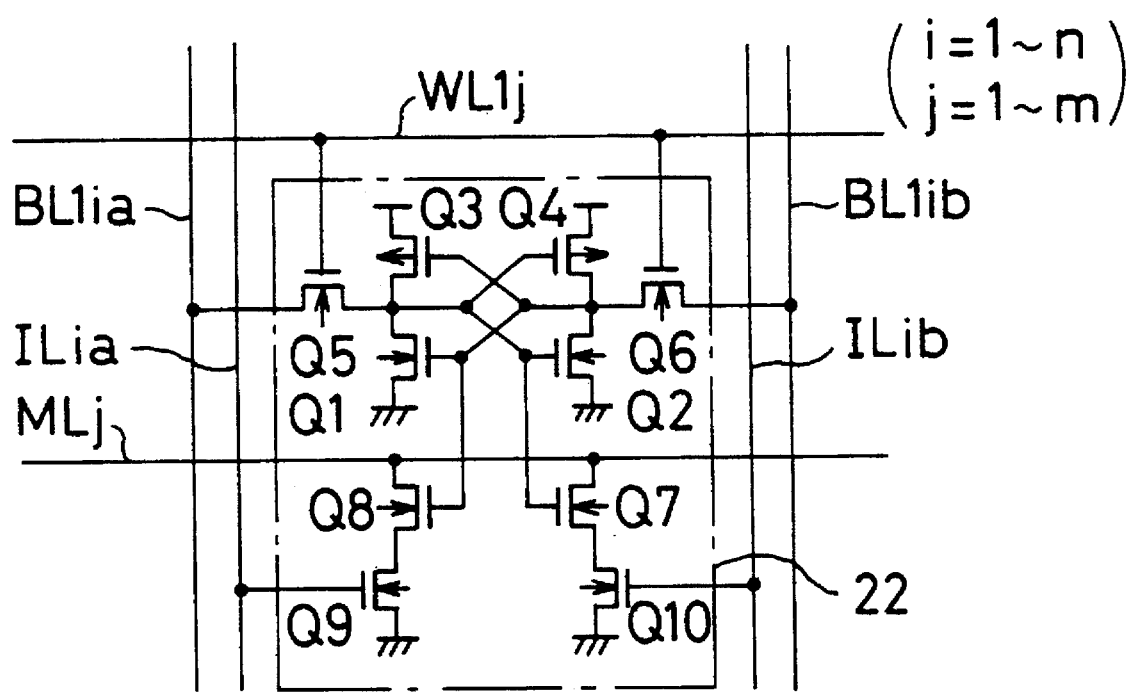
FIG. 4B is an enlarged circuit diagram of a memory cell used in the volatile memory illustrated in FIG. 4A.

Preferred embodiments in accordance with the present invention will be explained hereinbelow with reference to drawings.

Embodiment 1

FIG. 5 is a block diagram of a non-volatile memory in accordance with the first embodiment of the invention. The non-volatile memory has a cell array 31 including a plurality of memory cells 32 arranged in a form of a matrix. Each of the memory cells 32 has first and second transistors T1 and T2 which commonly have a floating gate and store data therein in accordance with a quantity of electric charge accumulated in the floating gate. There are disposed a plurality of first gate lines GL1j (j is an integer ranging from 1 to m both inclusive) associated with each of rows of the plurality of memory cells 32. Each of the plurality of first gate lines GL1j is in electrical connection with gates of the first transistors T1 of the memory cells 32 disposed in an associated row. There are also disposed a plurality of first drain lines DL1i (i is an integer ranging from 1 to n) associated with each of columns of the plurality of memory cells 32. Each of the plurality of first drain lines DL1i is in electrical connection with drains of the first transistors T1 of the memory cells 32 disposed in an associated column. There are further disposed a plurality of second gate lines GL2i associated with each of columns of the plurality of memory cells 32. Each of the plurality of second gate lines GL2i is in electrical connection with gates of the second transistors T2 of the memory cells 32 disposed in an associated column. There are further disposed a plurality of second drain lines DL2j associated with each of rows of the plurality of memory cells 32. Each of the plurality of second drain lines DL2j is in electrical connection with drains of the second transistors of the memory cells 32 disposed in an associated row. A plurality of source lines SL are in electrical connection with sources of the first and second transistors T1 and T2 of each of the memory cells 32.

The non-volatile memory further includes a source voltage switching circuit 33, a first voltage applying circuit 34, a first current detecting circuit 35, a second voltage applying circuit 36, a second current detecting circuit 37, and erasing circuits 38 and 39. The source voltage switching circuit 33 applies a voltage for erasion to the source lines SL on an erasing operation in which erasion signal EE is in active level, and applies a ground voltage to the source lines SL on operations other than an erasing operation. The first voltage applying circuit 34 applies one of a selection voltage and a non-selection voltage to each of the first gate lines GL1j in accordance with a first gate input signal GD1. The first current detecting circuit 35, on a reading operation, detects a current running through the first drain lines DL1i, amplifies the detected current, and transmits a first drain current signal DD1 corresponding to the detected signal. The second voltage applying circuit 36 applies one of a selection voltage and a non-selection voltage to each of the second gate lines GL2i in accordance with a second gate input signal GD2. The second current detecting circuit 37 detects a current running through the second drain lines DL2j, amplifies the detected current, and transmits a second drain current signal DD2 corresponding to the detected signal. The erasing circuits 38 and 39 apply a ground voltage to all of the first and second gate lines GL1j and GL2i on an erasing operation. These erasing circuits 38 and 39 are provided in the first and second voltage applying circuits 34 and 36, respectively.

Similarly to a conventional floating gate transistor type non-volatile memory, the non-volatile memory in accordance with the embodiment stores data utilizing the fact that threshold voltages of the first and second transistors T1 and T2 are varied in dependence on a quantity of charge accumulated in an electrically insulated floating gate.

Reading of data stored in the cell array 31 is carried out as follows. First, the source lines SL are grounded. Then, the first voltage applying circuit 34 applies a selection voltage (about 5 V) to one of the first gate lines GL1j. The first current detecting circuit 35 judges as to whether a current runs through the first bit lines BL1i, thereby reading data stored in the memory cell 32 being performed. Similarly, stored data can be read by using the second voltage applying circuit 36 and the second current detecting circuit 35. Thus, the non-volatile memory in accordance with the embodiment has a function of an orthogonal memory. Since the first and second transistors T1 and T2 have a common floating gate, threshold values of these transistors T1 and T2 vary in the same way. Thus, it is possible in the embodiment to read out a single data stored in the cell array 31 by means of two pair of the voltage applying circuits and the current detecting circuits.

The non-volatile memory in accordance with the invention further has a function of a content address memory. The first voltage applying circuit 36 applies a selection voltage (about 5 V) simultaneously to the first gate lines GL1i in accordance with the gate input signal GD1 with the source lines SL being grounded. Then, the first current detecting circuit 35 judges whether a current runs through the first drain lines DL1i. If it is detected a current runs through the first drain lines DL1i, at least one of the memory cells 32 connected to a certain drain line DL1i has a low threshold voltage. On the other hand, if it is detected that no current runs through the first drain lines DL1i, no memory cells 32 connected to a certain drain line DL1i have a low threshold voltage. This judgment can be carried out by using the second voltage applying circuit 36 and the second current detecting circuit 37. Thus, a function of a content address memory can be performed in the non-volatile memory in accordance with the embodiment.

As having been described, it is possible to compose a non-volatile memory having both an orthogonal memory and a content address memory of two transistors per a memory cell. In comparison with a conventional non-volatile memory in which eight or ten transistors have been required per a memory cell, the non-volatile memory in accordance with the embodiment provides a much smaller size, a larger capacitance and a lower consumption of electrical power.

An operation of writing data can be carried out by providing at least one of the first and second current detecting circuits 35 and 37 with a function with which it is possible to apply a voltage for writing corresponding to data to be written to the drain lines DL1i and DL2j, and further by setting the selection and non-selection voltages to be a voltage for writing. In addition, an operation of erasing stored data can be also carried out by transferring charges between a floating gate and a substrate by means of the source voltage switching circuit 33 and the first and second voltage applying circuits 34 and 36, similarly to a conventional floating gate transistor type non-volatile memory.

Figure 6A:
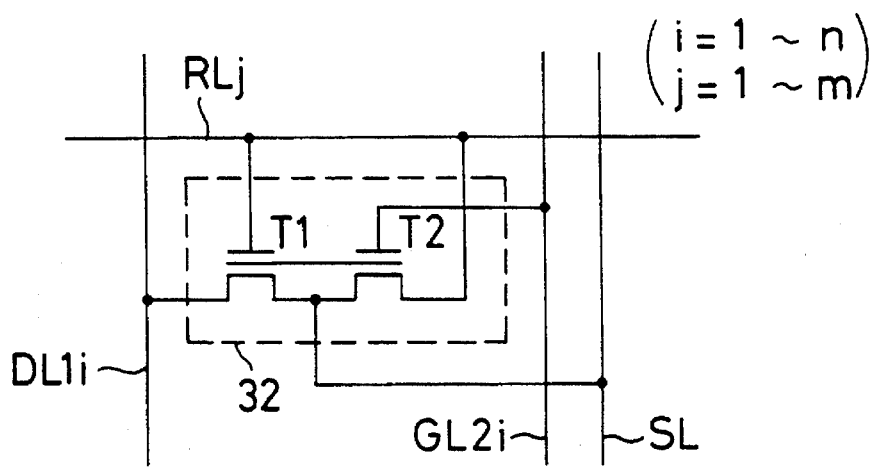
FIGS. 6A, 6B and 6C are partial block diagrams of a memory cell to be used in variants of the first embodiment.
Figure 6B:
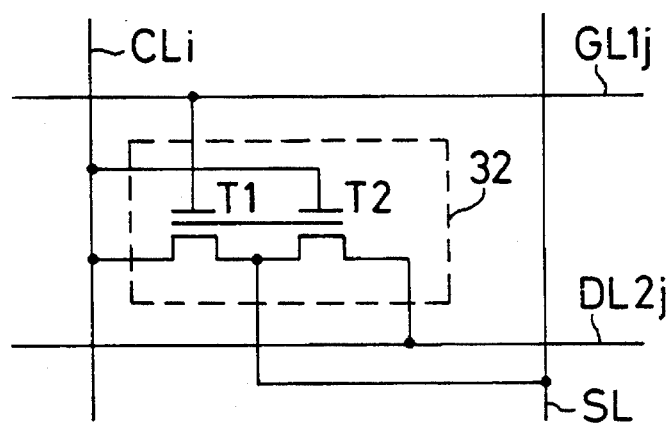
Figure 6C:
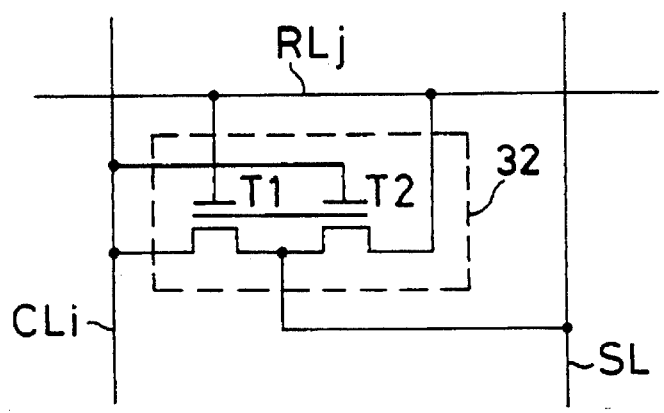

FIGS. 6A, 6B and 6C illustrate circuit diagrams of variants of the memory cell used in the first embodiment. As illustrated in FIG. 6A, the first gate line GL1j and the second drain line DL2j may be replaced with a single row line RLj. As illustrated in FIG. 6B, the first drain line DL1i and the second gate line GL2i may be replaced with a single column line CLi. Alternatively, as illustrated in FIG. 6C, it may be preferable to use both the row line RLj and the column line CLi. These variants of the memory cell make it possible to reduce signal lines in both row and column directions, and thereby reduce an area of the cell array 31, hence, an area of a chip.

Embodiment 2

FIG. 7 is a conceptual block diagram of the non-volatile memory in accordance with the second embodiment of the present invention. The non-volatile memory has a cell array 41 including a plurality of memory cells 42 arranged in a matrix. Each of the memory cells 42 has first and second transistors T1 and T2 which commonly have a floating gate and store data therein in accordance with a quantity of electric charge accumulated in the floating gate. The cell array 41 has the same structure as that of the cell array 31 shown in the first embodiment except that the first and second gate lines GL1j and GL2i are replaced with first and second word lines WL1j and WL2i, respectively, and that the first and second drain lines DL1i and DL2j are replaced with first and second bit lines BL1i and BL2j.

The cell array 41 further includes a source voltage switching circuit 43, a row address buffer circuit 44, a column address buffer circuit 45, a row decoder 46, a row writing/reading circuit 47, a column decoder 48, a column writing/reading circuit 49, a first voltage switching circuit 50 and a second voltage switching circuit 51.

The source voltage switching circuit 43 applies a voltage for erasion to the source lines SL on an erasing operation in which erasion signals EE are in active level, and applies a ground voltage to the source lines SL on operations other than an erasing operation. The row address buffer circuit 44 and column address buffer circuit 45 receive row address signals ADr and column address signals ADc, respectively, accumulate them therein, and transmit them as outputs.

The row decoder 46, on an erasing operation, applies a ground voltage to all of the first word lines WL1j, and, on a row writing operation in which row writing signals WEr are in active level and also on a row reading operation, applies a selection voltage to one of the first word lines WL1j in accordance with the row address signals ADr transmitted from the row address buffer circuit 44. The selection voltage is approximately 12 V for a row writing operation, and approximately 5 V for a row reading operation. The row decoder 46 is provided in place of the first voltage applying circuit 34 shown in the first embodiment.

The row writing/reading circuit 47, on a row writing operation, applies a voltage for writing (approximately 6 V) corresponding to input row data Di1 to the first bit lines BL1i, and, on a row reading operation, detects a current running through the first bit lines BL1i, amplifies the thus detected current, and transmits the amplified current as an output Do1. The row writing/reading circuit 47 is provided in place of the first current detecting circuit 35 shown in the first embodiment.

The column decoder 48, on an erasing operation, applies a ground voltage to all of the second word lines WL2i, and, on a column writing operation in which column writing signals WEc are in active level and also on a column reading operation, applies a selection voltage to one of the second word lines WL2i in accordance with the column address signals ADc transmitted from the column address buffer circuit 45. The selection voltage is approximately 12 V for a column writing operation, and approximately 5 V for a column reading operation. The column decoder 48 is provided in place of the second voltage applying circuit 36 shown in the first embodiment.

The column writing/reading circuit 49, on a column writing operation, applies a voltage for writing (approximately 6 V) corresponding to input column data Di2 to the second bit lines BL2j, and, on a column reading operation, detects a current running through the second bit lines BL2j, amplifies the thus detected current, and transmits the amplified current as an output Do2. The column writing/reading circuit 49 is provided in place of the second current detecting circuit 37 shown in the first embodiment.

The voltage switching circuit 50 provides a selection voltage, a voltage for writing, etc. to the row decoder 46 and the row writing/reading circuit 47, while the voltage switching circuit 51 provides the same to the column decoder 48 and the column writing/reading circuit 49. Thus, the non-volatile memory in accordance with the second embodiment works as an orthogonal memory.

As aforementioned, in the non-volatile memory in accordance with the second embodiment, the row decoder 46 selects one of the first word lines WL1j, and the row writing/reading circuit 47 detects a current running through the first bit lines BL1i, thereby collectively reading out data stored in the memory cells 42 disposed in a certain row.

Similarly, the column decoder 48 selects one of the second word lines WL2i, and the column writing/reading circuit 49 detects a current running through the second bit lines BL2k, thereby collectively reading out data stored in the memory cells 42 disposed in a certain column.

Writing can be carried out similarly to reading. Writing to the memory cells 42 disposed in a row direction can be carded out by means of the row decoder 46 and the row writing/reading circuit 47, while writing to the memory cells 42 disposed in a column direction can be carded out by means of the column decoder 48 and the column writing/reading circuit 49.

Thus, since the non-volatile memory in accordance with the second embodiment has a function of an orthogonal memory, writing or reading can be collectively carried out for the memory cells 42 disposed in a row or column direction in the cell array 41. This makes it easy to rapidly form a transposed matrix, for instance. In addition, since a memory cell is able to be composed of only two transistors similarly to the first embodiment, it is possible to obtain a smaller size, a larger capacitance and a lower consumption of electrical power of a memory cell.

Embodiment 3

Figure 8:
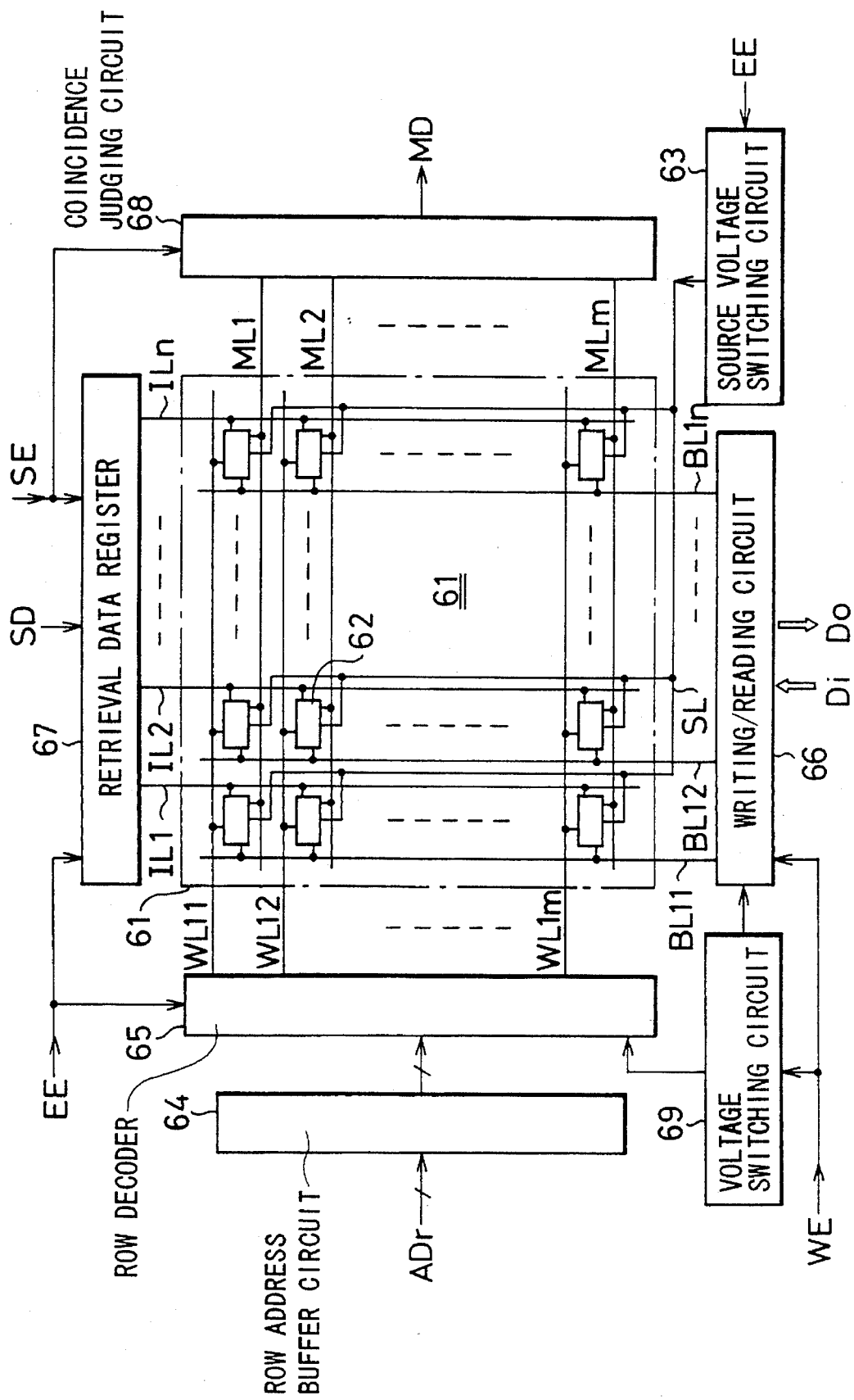
FIG. 8 is a block diagram of a non-volatile memory in accordance with the third embodiment of the present invention.

FIG. 8 is a conceptual block diagram of the non-volatile memory in accordance with the third embodiment of the present invention. The non-volatile memory has a cell array 61 including a plurality of memory cells 62 arranged in a matrix. Each of the memory cells 62 has first and second transistors T1 and T2 which commonly have a floating gate and store data therein in accordance with a quantity of electric charge accumulated in the floating gate. The cell array 61 has the same structure as that of the cell array 31 shown in the first embodiment except that the first and second gate lines GL1j and GL2i are replaced with word lines WL1j and retrieval lines ILi, respectively, and that the first and second drain lines DL1i and DL2j are replaced with bit lines BL1i and coincidence lines MLj, respectively.

The cell array 61 further includes a source voltage switching circuit 63, a row address buffer circuit 64, a row decoder 65, a writing/reading circuit 66, a retrieval data register 67, a coincidence judging circuit 68, and a voltage switching circuit 69.

The source voltage switching circuit 63 applies a voltage for erasion to the source lines SL on an erasing operation in which erasion signals EE are in active level, and applies a ground voltage to the source lines SL on operations other than an erasing operation. The row address buffer circuit 64 receives row address signals ADr, accumulates them therein, and transmits them as outputs.

The row decoder 65, on an erasing operation, applies a ground voltage to all of the word lines WL1j, and, on a writing operation in which writing signals WE are in active level and also on a reading operation, applies a selection voltage to one of the word lines WL1j in accordance with the row address signals ADr transmitted from the row address buffer circuit 64. The selection voltage is approximately 12 V for a writing operation, and approximately 5 V for a reading operation. The row decoder 65 is provided in place of the first voltage applying circuit 34 shown in the first embodiment.

The row writing/reading circuit 66, on a writing operation, applies a voltage for writing (approximately 6 V) corresponding to input row data Di to the bit lines BL1i, and, on a reading operation, detects a current running through the bit lines BL1i, amplifies the thus detected current, and transmits the amplified current as an output Do. The row writing/reading circuit 66 is provided in place of the first current detecting circuit 35 shown in the first embodiment.

The retrieval data register 67, on an erasing operation, applies a ground voltage to all of the retrieval lines ILi, and, on a retrieving operation in which retrieval signals SE are in active level, applies one of a selection voltage (approximately 5 V) and a ground voltage to each of the retrieval lines ILi in accordance with retrieval data SD transmitted from outside. The retrieval data register 67 is provided in place of the second voltage applying circuit 36 shown in the first embodiment.

The coincidence judging circuit 68, on a retrieving operation, detects a current running through the coincidence lines MLj, amplifies the thus detected current, and transmits the amplified current as an output MD. The coincidence judging circuit 68 is provided in place of the second current detecting circuit 37 shown in the first embodiment.

The voltage switching circuit 69 provides a selection voltage, a voltage for writing, etc. to the row decoder 65 and the writing/reading circuit 66. Thus, the non-volatile memory in accordance with the third embodiment works as a content address memory.

In the non-volatile memory in accordance with the third embodiment, the row decoder 65 and the writing/reading circuit 66 cooperate to carry out a reading or writing operation similarly to a conventional non-volatile memory. In addition, it is possible to detect a group of the memory cells 62 all of which have a high threshold voltage, among the memory cells 62 selected by the retrieval lines ILi, by causing the retrieval data register 67 to apply a selection voltage (approximately 5 V) simultaneously to the predetermined number of retrieval lines ILi in accordance with the retrieval data SD transmitted from outside, and further by detecting a current running through the coincidence lines MLj at that time by means of the coincidence judging circuit 68.

Specifically, if at least one memory cell has a low threshold voltage among selected memory cells, a current would be detected in a coincidence line MLj to which the memory cell is connected. Alternatively, if all of selected memory cells have a high threshold voltage, a current would not be detected in a coincidence line MLj to which all of the selected memory cells are connected.

Thus, the non-volatile memory in accordance with the embodiment can perform functions of a content address memory. For instance, the non-volatile memory can retrieve data base by storing a single instant characteristic in every row and further by providing an instance characteristic to be retrieved with the retrieval data SD.

Similarly to the first and second embodiments, the third embodiment makes it possible to obtain a smaller size, a larger capacitance and a lower consumption of electrical power of a memory.

In the above mentioned embodiments 1 to 3, writing data into a memory cell and erasing data stored in a memory cell can be carried out by using one of the transistors T1 and T2 of the memory cell. Alternatively, both of the transistors T1 and T2 may be used. In the second embodiment, writing data can be carried out in both each row and each column. It is possible to arrange that writing data can be carried out in either each row or each column.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

What is claimed is:

1. A non-volatile memory comprising:

(A) a cell array, said cell array comprising: (a) a plurality of memory cells arranged in a form of a matrix, each of said memory cells having first and second transistors which commonly have a floating gate and storing data therein in accordance with a quantity of electric charge accumulated in said floating gate; (b) a plurality of first gate lines associated with each of rows of said plurality of memory cells, each of said plurality of first gate lines being in electrical connection with gates of said first transistors of said memory cells disposed in an associated row; (c) a plurality of first drain lines associated with each of columns of said plurality of memory cells, each of said plurality of first drain lines being in electrical connection with drains of said first transistors of said memory cells disposed in an associated column; (d) a plurality of second gate lines associated with each of columns of said plurality of memory cells, each of said plurality of second gate lines being in electrical connection with gates of said second transistors of said memory cells disposed in an associated column; (e) a plurality of second drain lines associated with each of rows of said plurality of memory cells, each of said plurality of second drain lines being in electrical connection with drains of said second transistors of said memory cells disposed in an associated row; and (f) a plurality of source lines, each being in electrical connection with sources of said first and second transistors of each of said memory cells;

(B) a first voltage applying circuit for applying one of a selection voltage and a non-selection voltage to each of said first gate lines in accordance with a first gate receiving signal;

(C) a first current detecting circuit for detecting a current running through said plurality of first drain lines and correspondingly transmitting a first drain current signal;

(D) a second voltage applying circuit for applying one of a selection voltage and a non-selection voltage to each of said second gate lines in accordance with a second gate receiving signal; and (E) a second current detecting circuit for detecting a current running through said plurality of second drain lines and correspondingly transmitting a second drain current signal.

2. The non-volatile memory as recited in claim 1 further comprising a source voltage switching circuit for applying a voltage for erasion to said source lines on an erasing operation and applying a ground voltage to said source lines on operations other than an erasing operation, and an eraser for applying a ground voltage to said first and second gate lines on an erasing operation.

3. The non-volatile memory as recited in claim 2, wherein said eraser is disposed in said first and second voltage applying circuits.

4. The non-volatile memory as recited in claim 1 further comprising a writer for applying a selection voltage for writing to one of said first and second gate lines, and further applying one of a selection voltage and a non-selection voltage for writing to one of said first and second drain lines on a writing operation.

5. A non-volatile memory comprising:

(A) a cell array, said cell array comprising: (a) a plurality of memory cells arranged in a form of a matrix, each of said memory cells having first and second transistors which commonly have a floating gate and storing data therein in accordance with a quantity of electric charge accumulated in said floating gate; (b) a plurality of first gate lines associated with each of rows of said plurality of memory cells, each of said plurality of first gate lines being in electrical connection with gates of said first transistors of said memory cells disposed in an associated row; (c) a plurality of first drain lines associated with each of columns of said plurality of memory cells, each of said plurality of first drain lines being in electrical connection with drains of said first transistors of said memory cells disposed in an associated column; (d) a plurality of second gate lines associated with each of columns of said plurality of memory cells, each of said plurality of second gate lines being in electrical connection with gates of said second transistors of said memory cells disposed in an associated column; (e) a plurality of second drain lines associated with each of rows of said plurality of memory cells, each of said plurality of second drain lines being in electrical connection with drains of said second transistors of said memory cells disposed in an associated row; and (f) a plurality of source lines, each being in electrical connection with sources of said first and second transistors of each of said memory cells;

(B) a first voltage applying circuit for applying a selection voltage to one of said plurality of first gate lines in accordance with a row address signal contained in a first gate receiving signal on a row reading operation;

(C) a row reading circuit for detecting a current running through said plurality of first drain lines on a row reading operation;

(D) a second voltage applying circuit for applying a selection voltage to one of said plurality of second gate lines in accordance with a column address signal contained in a second gate receiving signal on a column reading operation; and (E) a column reading circuit for detecting a current running through said plurality of second drain lines on a column reading operation.

6. A non-volatile memory comprising:

(A) a cell array, said cell array comprising: (a) a plurality of memory cells arranged in a form of a matrix, each of said memory cells having first and second transistors which commonly have a floating gate and storing data therein in accordance with a quantity of electric charge accumulated in said floating gate; (b) a plurality of first gate lines associated with each of rows of said plurality of memory cells, each of said plurality of first gate lines being in electrical connection with gates of said first transistors of said memory cells disposed in an associated row; (c) a plurality of first drain lines associated with each of columns of said plurality of memory cells, each of said plurality of first drain lines being in electrical connection with drains of said first transistors of said memory cells disposed in an associated column; (d) a plurality of second gate lines associated with each of columns of said plurality of memory cells, each of said plurality of second gate lines being in electrical connection with gates of said second transistors of said memory cells disposed in an associated column; (e) a plurality of second drain lines associated with each of rows of said plurality of memory cells, each of said plurality of second drain lines being in electrical connection with drains of said second transistors of said memory cells disposed in an associated row; and (f) a plurality of source lines, each being in electrical connection with sources of said first and second transistors of each of said memory cells;

(B) a voltage applying circuit for applying a selection voltage to one of said plurality of first gate lines in accordance with a row address signal contained in a first gate receiving signal on a row reading operation;

(C) a row reading circuit for detecting a current running through said plurality of first drain lines on a row reading operation;

(D) a retrieval data setting circuit for applying one of a selection voltage and a non-selection voltage to each of said plurality of second gate lines in accordance with retrieval data contained in a second gate receiving signal on a retrieving operation; and (E) a coincidence determining circuit for detecting a current running through said plurality of second drain lines on a retrieving operation.

7. The non-volatile memory as recited in claim 6 further comprising a source voltage switching circuit for applying a voltage for erasion to said source lines on an erasing operation and applying a ground voltage to said source lines on operations other than an erasing operation, and an eraser for applying a ground voltage to said first and second gate lines on an erasing operation.

8. The non-volatile memory as recited in claim 7, wherein said eraser is disposed in said first and second voltage applying circuits.

9. The non-volatile memory as recited in claim 6 further comprising a writer for applying a selection voltage for writing to one of said first gate lines, and further applying one of a selection voltage and a non-selection voltage for writing to one of said first drain lines on a writing operation.

10. A non-volatile memory comprising:

(A) a cell array, said cell array comprising: (a) a plurality of memory means, arranged to form rows and columns, for storing data therein, each having first and second transistors which commonly have a floating gate; (b) a plurality of first gate lines, each being in electrical connection with gates of said first transistors of said memory means disposed in each of said rows; (c) a plurality of first drain lines, each being in electrical connection with drains of said first transistors of said memory means disposed in each of said columns; (d) a plurality of second gate lines, each being in electrical connection with gates of said second transistors of said memory means disposed in each of columns; (e) a plurality of second drain lines, each being in electrical connection with drains of said second transistors of said memory means disposed in each of rows; and (f) a plurality of source lines, each being in electrical connection with sources of said first and second transistors of each of said memory means;

(B) means for applying one of first and second voltages to each of said first gate lines in accordance with a first input signal;

(C) means for detecting a current running through said plurality of first drain lines and further transmitting a first output signal;

(D) means for applying one of first and second voltages to each of said second gate lines in accordance with a second input signal; and (E) means for detecting a current running through said plurality of second drain lines and further transmitting a second output signal.

11. The non-volatile memory as recited in claim 10 further comprising:

(F) means for applying a certain voltage to said source lines on an erasing operation and applying a ground voltage to said source lines on operations other than an erasing operation; and (G) means for applying a ground voltage to said first and second gate lines on an erasing operation.

12. The non-volatile memory as recited in claim 10 further comprising means for applying a first voltage to one of said first and second gate lines, and further applying one of first and second voltages to one of said first and second drain lines on a writing operation.

13. The non-volatile memory as recited in claim 10, wherein said plurality of first gate lines and second drain lines of each row of said memory cells are replaced with a single row line.

14. The non-volatile memory as recited in claim 10, wherein said plurality of first drain lines and second gate lines of each column of said memory cells are replaced with a single column line.

* * * * *